United States Patent [19]

Jackson

[11] Patent Number: 5,714,909
[45] Date of Patent: Feb. 3, 1998

[54] TRANSIMPEDANCE AMPLIFIER AND METHOD FOR CONSTRUCTING SAME

[75] Inventor: H. Spence Jackson, Austin, Tex.

[73] Assignee: Sigmatel, Inc., Austin, Tex.

[21] Appl. No.: 661,333

[22] Filed: Jun. 14, 1996

[51] Int. Cl.$^6$ .................................................. H03F 3/08
[52] U.S. Cl. ............................................... 330/308; 250/214 A
[58] Field of Search .......................... 250/214 A; 330/59, 330/110, 288, 294, 308

[56] References Cited

U.S. PATENT DOCUMENTS

| | | | |
|---|---|---|---|
| 4,498,001 | 2/1985 | Smoot | 250/214 A |
| 4,623,786 | 11/1986 | Rodwell | 330/59 X |
| 5,606,282 | 2/1997 | Yoshida | 330/308 X |

OTHER PUBLICATIONS

"Photodiode–AMP Nulls Ambient Light" by R. Mark Stitt and Wally Meinel, Burr–Brown Corp., Tucson, AZ, Dec. 16, 1993.

"Threshold Detection of Visible and Infrared Radiaton with PIN Photodiodes" by Hewlett packard, Application Note 915.

"UV–Visible and Near IR Silicon Photodectors" (adapted from Sensors, vol. 6, Optical Sensors, Chapt. 8, VCH–Verlag, Weinheim 1991.

"Characteristics and use of Photodiodes".

"An Instantaneous Response CMOS Optical Receiver IC with Wide Dynamic Range and Extremely High Sensitivity Using Feed–Forward Auto–Bias Adjustment", Makoto Nakamura, Noboru Ishihara, Yukio Akazawa, and Hideaki Kimura, 1995.

"Infrared Light–Emitting Diode Application Circuits", Sharp Opto Application Note, Optoelectronics.

*Primary Examiner*—Steven Mottola
*Attorney, Agent, or Firm*—Baker & Botts L.L.P.

[57] ABSTRACT

A transimpedance amplifier (10, 50) is provided for processing a current signal received from a circuit device (12, 52). The circuit device (12, 52) can be a photodiode used to receive infrared transmissions. The transimpedance amplifier (10, 50) includes a first stage (14, 54) coupled to an input node. The first stage (14, 54) has a first amplifier (20, 60) operable to drive the input node and is operable to provide a current signal to a second node (NODE 3, NODE 2) in response to a current signal in the input node. A second stage (16, 56) is connected to the second node (NODE 3, NODE 2). The second stage (16, 56) has a second amplifier (32, 68) and is operable to convert the current signal in the second node (NODE 3, NODE 2) into an output voltage signal ($V_{OUT}$) at an output node. A feedback loop (18, 58) can be connected to receive the output voltage signal ($V_{OUT}$) and to provide a feedback current signal to cancel ambient noise in the current signal in the input node.

18 Claims, 2 Drawing Sheets

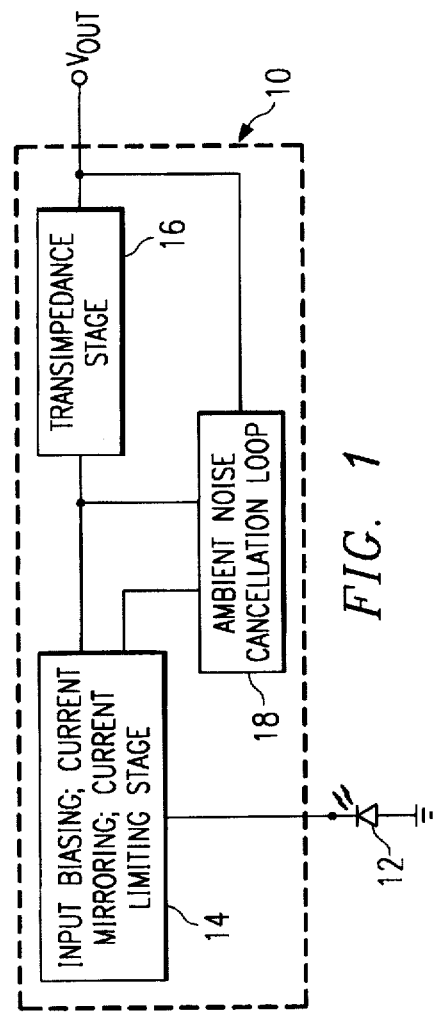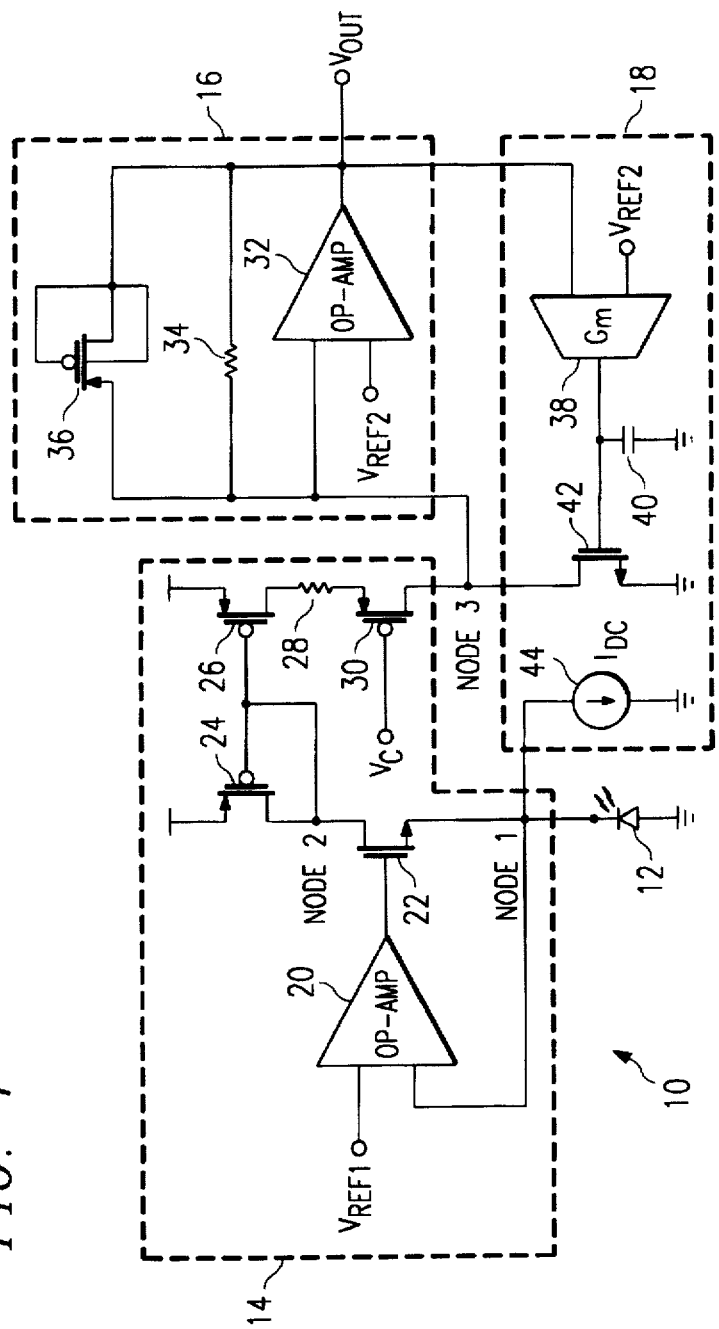

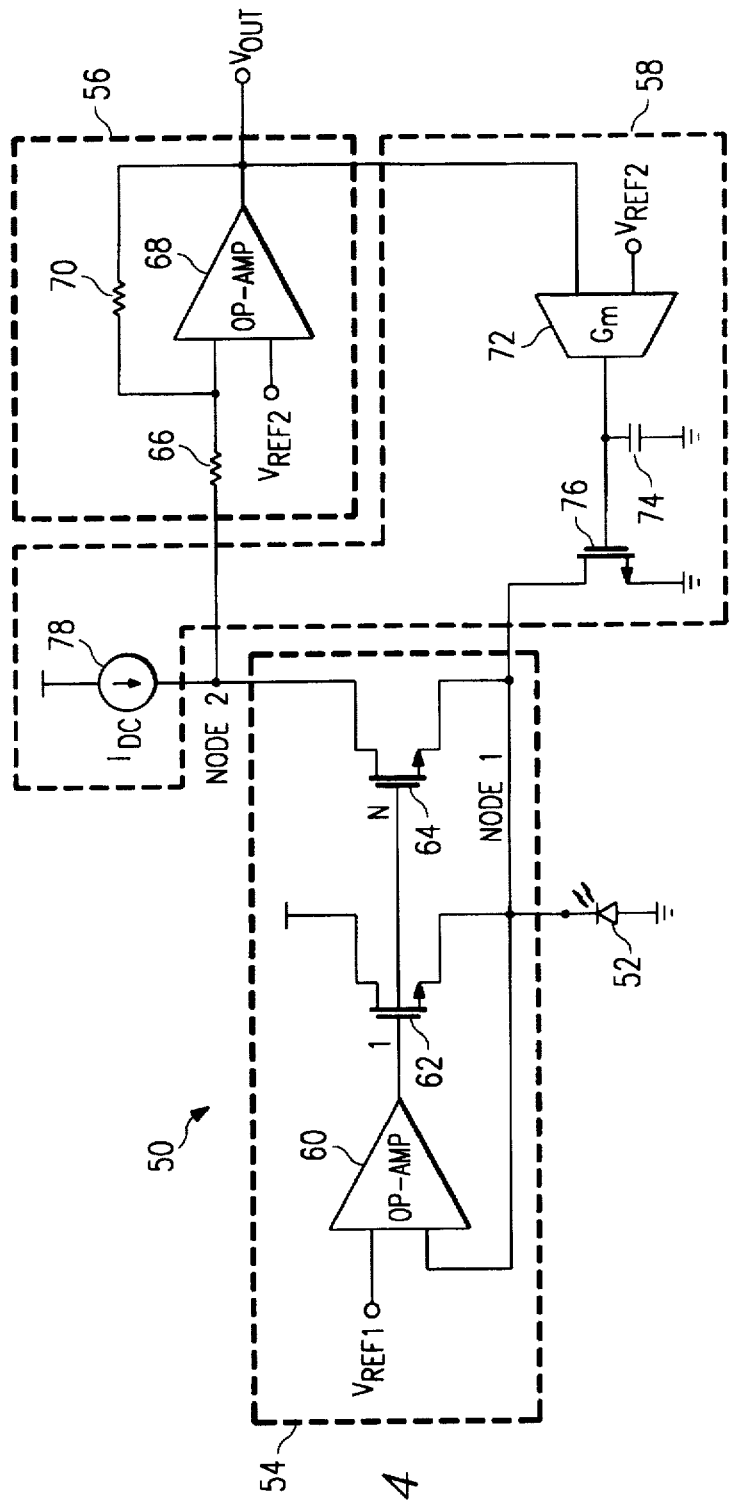
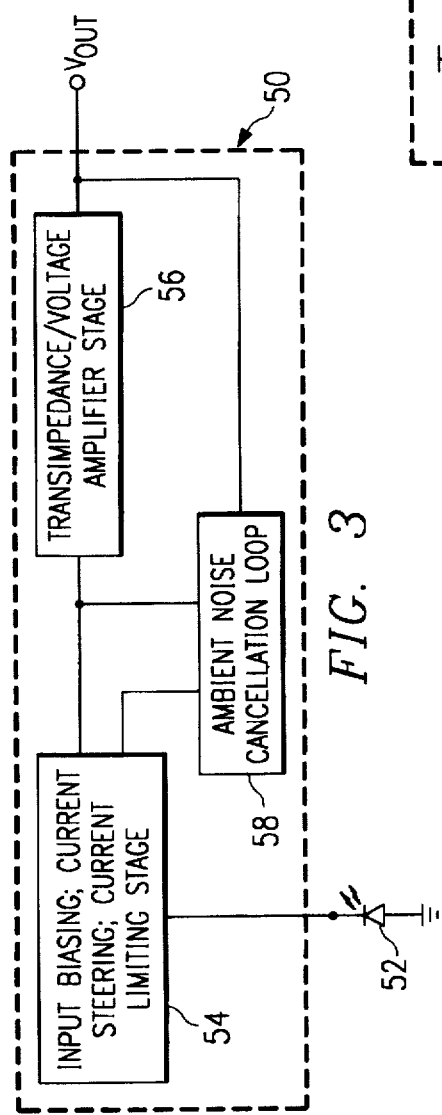
FIG. 3
FIG. 4

5,714,909

TRANSIMPEDANCE AMPLIFIER AND METHOD FOR CONSTRUCTING SAME

TECHNICAL FIELD OF THE INVENTION

This invention relates in general to the field of electronic circuits, and more particularly to a transimpedance amplifier that has low noise, high speed, and a wide dynamic range and a method of constructing same.

BACKGROUND OF THE INVENTION

Transimpedence amplifiers are frequently used in preamp stages to process current signals from a circuit device, including current signals produced by a photodiode used for infrared communications. For example, a transimpedance amplifier can be used to process the reverse current that is produced by a photodiode as a function of infrared signal energy received by the photodiode. The transimpedance amplifier converts the current signal into a voltage signal which can then be processed to recover the communicated information. The electronics, computer and other industries commonly use such infrared receivers and transmitters for communicating information between devices.

Conventional transimpedance amplifiers, however, can suffer from problems caused by ambient noise, the dynamic range of the transmitted signal, and high speed communication. These problems arise, in particular, with respect to infrared transmitters and receivers. Infrared transmissions are easily scattered and subject to wide ranges of noise sources. The dynamic range of the transmitted signal can be a problem because the signal produced at a minimum range can be much larger than that produced at a maximum range. For example, operation parameters for infrared communications are defined by the IRDA (Infrared Data Association) specification committee, and one IRDA specification calls for transmissions to be received from a range of zero to three meters. In addition, communication rates for infrared transmissions can be relatively high and require a transimpedance amplifier that can handle the high speeds. For example, the IRDA specification mentioned above also calls for infrared transceivers to handle communication rates from a minimum of 2400 bits per second to a maximum of four megabits per second. Another problem which arises with respect to conventional transimpedance amplifiers is an inability to operate at low supply voltages (e.g., 3 volts) for such a large dynamic range and high communication speeds.

SUMMARY OF THE INVENTION

In accordance with the present invention, a transimpedance amplifier having low noise, high speed, and a wide dynamic range and a method for constructing same are provided that substantially eliminate or reduce disadvantages and problems associated with previously developed transimpedance amplifiers.

In accordance with one aspect of the present invention, a transimpedance amplifier is provided for processing a current signal received from a circuit device. The circuit device can be a photodiode used to receive infrared transmissions. The transimpedance amplifier includes a first stage coupled to an input node for receiving a current signal from a circuit device. The first stage has a first amplifier operable to drive the input node and is operable to provide a current signal to a second node in response to the current signal at the input node. The transimpedance amplifier includes a second stage connected to the second node. The second stage has a second amplifier and is operable to convert the current signal at the second node into an output voltage signal at an output node. A feedback stage can be connected to receive the output voltage and to provide a feedback current signal to cancel ambient noise in the current signal at the input node.

A technical advantage of the present invention is higher stability produced by separating the driving of the input node and the performing of transimpedance amplification into two stages. One stage uses an amplifier to drive and control the input node, and a second stage uses an amplifier to perform transimpedance amplification. This separation allows operation at low supply voltages and eliminates stability issues associated with having two high gain circuits inside a single feedback loop. In addition, this allows the transimpedance amplification to be made larger allowing better amplification for small current signals.

Another technical advantage of the present invention is the provision of a high speed transimpedance amplifier that handles a large dynamic range of input current signals where the transimpedance amplifier can be implemented in a CMOS process.

A further technical advantage of the present invention is that op-amps used in the implementation do not cease functioning in linear region for signals in the upper end of the dynamic range. Thus, the transimpedance amplifier of the present invention can be used for applications such as infrared receivers and solves the dynamic range problem present in conventional devices.

An additional technical advantage of the present invention is the provision of a transimpedance amplifier structure that drives the source of the current signal, such as a photodiode, at a virtual ground. When a current pulse is produced, the source is regulated to within the response time of the transimpedance amplifier.

A further technical advantage of the present invention is the stability produced by a feedback stage forming an ambient noise cancellation loop that implements a high pass response for attenuating low freg and DC components.

BRIEF DESCRIPTION OF THE DRAWINGS

A more complete understanding of the present invention and advantages thereof may be acquired by referring to the following description taken in conjunction with the accompanying drawings in which like reference numbers indicate like features and wherein:

FIG. 1 is a block diagram of one embodiment of a transimpedance amplifier constructed according to the teachings of the present invention;

FIG. 2 is a circuit diagram of one implementation of the transimpedance amplifier of FIG. 1;

FIG. 3 is a block diagram of another embodiment of a transimpedance amplifier constructed according to the teachings of the present invention; and FIG. 4 is a circuit diagram of one implementation of the transimpedance amplifier of FIG. 3.

DETAILED DESCRIPTION OF THE INVENTION

FIG. 1 is a block diagram of one embodiment of a transimpedance amplifier, indicated generally at 10, constructed according to the teachings of the present invention. Transimpedance amplifier 10 has an input node connected to a circuit device 12 and receives a current signal produced by circuit device 12. In the illustrated embodiment, circuit device 12 is a photodiode and is connected to ground potential, as shown.

In the embodiment of FIG. 1, transimpedance-amplifier 10 operates to process current signals produced by photodiode 12 in response to infrared transmissions and to provide an output, $V_{OUT}$. Typically, the infrared transmissions can be sequences of pulses that photodiode 12 can convert to current pulses. Transimpedance amplifier 10 can, in turn, convert the current pulses to voltage pulses at the output, $V_{OUT}$. It should be understood, however, that transimpedance amplifier 10 can be useful for processing current signals produced by sources other than photodiodes and is not limited to use with photodiodes in infrared communication schemes. In one embodiment, transimpedance amplifier 10 can be implemented as part of an integrated circuit formed on a semiconductor chip using a CMOS process, where the integrated circuit performs the functions of reception and transmission of infrared data.

Transimpedance amplifier 10 comprises a first stage 14 that is connected to the input node and to photodiode 12. First stage 14 provides input biasing, current mirroring and current limiting functions. A second stage 16 is connected to first stage 14 and provides the output, $V_{OUT}$. Second stage 16 provides a transimpedance amplifier function. A feedback stage 18 is connected to the output, $V_{OUT}$, to first stage 14 and to second stage 16, and provides a feedback current for ambient noise cancellation.

In operation, photodiode 12 produces a current signal responsive to receiving infrared transmissions as well as receiving ambient noise. First stage 14 operates to drive photodiode 12 in a reverse bias state to allow proper operation of photodiode 12 and to receive the current signal from photodiode 12. First stage 14 also provides current mirroring of the current signal produced by photodiode 12 as well as current limiting for current signals at the upper end of the dynamic range. The current mirroring by first stage 14 provides a mirrored current signal to second stage 16. Second stage 16 operates as a transimpedance amplifier to amplify the mirrored current signal to produce the output, $V_{OUT}$.

Feedback stage 18 operates to monitor the output, $V_{OUT}$, and to produce a feedback current responsive to $V_{OUT}$. The feedback current is used to cancel ambient noise in the form of low frequency and DC components of the current signal produced by photodiode 12. This cancellation provides attenuation of ambient noise present in the current signal. In general, feedback stage 18 acts as an integrator which provides a high pass response to convert low frequency and DC components of the output, $V_{OUT}$, into current components that are looped back to attenuate components of the current signal caused by ambient noise.

A technical advantage of the present invention is higher stability produced by separating the driving of the input node and the performing the transimpedance amplification into two stages. First stage 14 uses an amplifier to drive and control the input node, and second stage 16 uses an amplifier to perform transimpedance amplification. This separation allows operation at low supply voltages and eliminates stability issues associated with having two high gain circuits inside a single feedback loop. In addition, this allows the transimpedance to be made larger allowing better amplification under very small signal currents.

Another technical advantage of the present invention is the provision of a high speed transimpedance amplifier that handles a large dynamic range of input current signals where the transimpedance amplifier can be implemented in a CMOS process.

FIG. 2 is a circuit diagram of one implementation of transimpedance amplifier 10 of FIG. 1. The circuit of FIG. 2 can be constructed as an integrated circuit using a CMOS process. As described above, transimpedance amplifier 10 includes first stage 14, a second stage 16 and a feedback stage 18.

First stage 14 includes a high speed op-amp 20 which has two inputs and an output. One input of op-amp 20 is connected to a voltage reference, $V_{REF1}$. The other input is connected to a first node, NODE 1, connected to photodiode 12, as shown. First stage 14 also includes a first N-channel transistor 22. N-channel transistor 22 has a drain connected to a second node, NODE 2, a source connected to NODE 1 and a gate connected to the output of op-amp 20. A current mirror circuit is formed by a P-channel transistor 24 and a P-channel transistor 26. P-channel transistor 24 has a source connected to a power supply, a drain connected to NODE 2, and a gate connected to NODE 2. P-channel transistor 26 has a source connected to the power supply, and a gate connected to NODE 2 and a drain. A resistor 28 is connected to the drain of P-channel transistor 26, as shown. Another P-channel transistor 30 has a source connected to resistor 28, a drain connected to a third node, NODE 3, and a gate connected to a cascode voltage reference, $V_C$.

Second stage 16 includes a high speed op-amp 32 that has two inputs and an output. One input of op-amp 32 is connected to NODE 3, and the other input is connected to a voltage reference, $V_{REF2}$. The voltage references $V_{REF1}$ and $V_{REF2}$ are set according to the supply voltage. In one embodiment, $V_{REF1}$ is 0.7 volts, and $V_{REF2}$ is 1.4 volts for a 2.7 volt supply. The output of op-amp 32 provides the output, $V_{OUT}$, for transimpedance amplifier 10. As shown, a resistor 34 is connected between the first input and the output of op-amp 32. A P-channel transistor 36 is connected as a diode between the first input and the output of op-amp 32. P-channel transistor 36 has a source connected to NODE 3, and a drain, gate and bulk connected to the output of op-amp 32.

Feedback stage 18 includes a transconductance amplifier 38 which has two inputs and an output. One input of transconductance amplifier 32 is connected to the output, $V_{OUT}$, and the other input is connected to a reference voltage, $V_{REF2}$. A capacitor 40 is connected between the output of transconductance amplifier 38 and ground potential. Together, transconductance amplifier 38 and capacitor 40 form an integrator for providing feedback from the output, $V_{OUT}$. Feedback stage 18 also includes an N-channel transistor 42 which has a gate connected to the output of transconductance amplifier 38, a drain connected to NODE 3 and a source connected to ground potential. Feedback stage 18 further includes a current source 44 connected between NODE 1 and ground potential. Current source 44 pulls a steady current, $I_{DC}$, to provide bias current for N-Channel transistor 22.

In operation, transimpedance amplifier 10 processes current signals produced by photodiode 12 to provide voltage output, $V_{OUT}$. In the implementation of FIG. 2, op-amp 20 in first stage 14 is a high speed op-amp that operates to regulate and provide a virtual ground for NODE 1. Op-amp 20 drives at its output N-channel transistor 22. N-channel transistor 22 drives the input node, NODE 1, which is attached to photodiode diode 12 and the current mirror circuit formed by P-channel transistors 24 and 26. The current mirror circuit provides a current signal to resistor 28 mirrored from the current signal at NODE 1. Resistor 28 provides a current limit for current flowing to NODE 3, and P-channel transistor 30 is a cascode transistor which sets the voltage level at the bottom of resistor 28.

A technical advantage of the present invention is the provision of a structure for transimpedance amplifier 10 that drives the input node for the current signal at a virtual ground. When a current pulse is produced, the source is regulated to within the response time of transimpedance amplifier 10.

Second stage 16 operates as a transimpedance amplifier to convert the current signal at NODE 3 to the voltage output, $V_{OUT}$. Op-amp 32 acts as a transimpedance amplifier with a gain set by resistor 34. Op-amp 32 is selected to handle the maximum signal current as limited by resistor 28. The diode formed by P-channel transistor 36 turns on and limits the impedance across resistor 34 when the voltage across P-channel transistor 36 reaches the diode turn-on voltage. The connection of the bulk of P-channel transistor 36 to the drain produces a reverse body effect and decreases the threshold voltage for the diode formed by P-channel transistor 36.

A technical advantage of the present invention is the fact that neither op-amp 20 or op-amp 28 cease functioning in linear region for signals in the upper end of the dynamic range. Thus, transimpedance amplifier 10 of the present invention provides an interface for applications such as infrared receivers and solves the dynamic range problem present in conventional devices.

Feedback stage 18 includes transconductance amplifier 38 and capacitor 40 which operate to create a noise cancellation current. These devices create an integrator which acts like a high pass filter. Transconductance amplifier 38 and capacitor 40 drive the feedback current through N-channel transistor 42. Transconductance amplifier 32 monitors the output, $V_{OUT}$, and compares the output with the same voltage reference, $V_{REF2}$, used by op-amp 32. Transconductance amplifier 32 then operates to force the difference to zero to provide negative feedback. Any current signal that is lower frequency than the cut-off frequency of feedback stage 18 will be substantially attenuated. Higher frequency signals will pass through because feedback stage 18 does not react quickly enough to cancel the signal. The reaction of feedback stage 18 is set by transconductance amplifier 32 which is designed to provide feedback for low frequency and DC components. For example, if the output, $V_{OUT}$, consists of a series of higher frequency pulses, ambient noise cancellation loop 18 attenuates or cancels any underlying low frequency or DC noise.

The noise cancellation performed by feedback stage 18 is beneficial to the function of an infrared receiver circuit. An infrared receiver device, such as a photodiode, generally accepts any form of infrared radiation including both a transmitted signal as well as ambient noise. Typically, the strength of a minimum transmitted signal produces a current signal in the range of ten to hundred's of nanoamps. However, typical ambient noise can produce currents that are several orders of magnitude larger. For example, near a window, there can be an infrared component of the sunlight coming into the window that produces current signals one to three orders of magnitude greater than that produced by a transmitted infrared signal. Thus, it is important to cancel the ambient noise so that the transmitted signal can be recovered.

In general, ambient infrared noise produces a substantially constant current component that would saturate the output of transimpedance amplifier 10 if not canceled. Current source 44 provides a bias current $I_{DC}$, and N-channel transistor 42 provides a cancellation current to remove low frequency components from the circuit. Essentially, feedback stage 18 operates as a high pass filter to remove the low frequency and DC components of the current signal produced ambient noise received by photodiode 12.

A technical advantage of the present invention is the stability produced by feedback stage 18 implementing a low frequency pole widely separated from the pole of second stage 16.

FIG. 3 is a block diagram of another embodiment of a transimpedance amplifier, indicated generally at 50, constructed according to the teachings of the present invention. Transimpedance amplifier 50 is similar in structure to that shown in FIG. 1, and provides similar technical advantages. Transimpedance amplifier 50 is connected to a photodiode 52 and receives a current signal produced by photodiode 52. Photodiode 52 is connected to ground potential and is oriented as shown.

As with the embodiment of FIG. 1, transimpedance amplifier 50 operates to process current signals produced by photodiode 52 and to provide an output, $V_{OUT}$. In one embodiment of the present invention, transimpedance amplifier 50 is implemented as part of an integrated circuit formed on a semiconductor chip using a CMOS process, where the integrated circuit performs the functions of reception and transmission of infrared data. It should be understood, however, that transimpedance amplifier 50 is also useful for processing current signals produced by sources other than photodiodes and is not limited to use with photodiodes in infrared communication schemes.

Transimpedance amplifier 50 comprises a first stage 54 that is connected to photodiode 52 and provides input biasing, current steering and current limiting functions. A second stage 56 is connected to first stage 54 and provides the output, $V_{OUT}$, and performs transimpedance and voltage amplifier functions. A feedback stage 58 is connected to the output, $V_{OUT}$, to first stage 54 and to second stage 56, as shown.

In operation, photodiode 52 produces a current signal responsive to receiving infrared transmissions and ambient infrared noise. First stage 54 operates to drive the input node to bias photodiode 52 in a reverse bias state to allow proper operation of photodiode 52. First stage 54 also accomplishes current steering to provide a current signal to second stage 56 responsive to the current signal produced by photodiode 52. First stage 54 also accomplishes current limiting for current signals at the upper end of the dynamic range.

Second stage 56 operates to convert the current signal provided by first stage 54 into the output, $V_{OUT}$. Second stage 56 has two regions of operation depending upon whether the current signal is small or large scale. For small scale signals, second stage 56 operates as a transimpedance amplifier to amplify the current signal to produce the output, $V_{OUT}$. For large scale signals, Second stage 56 operates as a voltage amplifier to amplify a voltage produce by the larger current signal and produce the output, $V_{OUT}$.

Feedback stage 58 operates to monitor the output, $V_{OUT}$, and produce a current responsive to $V_{OUT}$ to cancel low frequency and DC components of the current signal produced by photodiode 52. In general, feedback stage 58 acts as a transconductance amplifier to convert the low frequency and DC components of the output, $V_{OUT}$, into current components that are looped back to cancel components of the current signal caused by ambient noise.

FIG. 4 is a circuit diagram of one implementation of transimpedance amplifier 50 of FIG. 3. The implementation of FIG. 4 provides similar technical advantages to those described above. The circuit of FIG. 4 can be constructed as an integrated circuit using a CMOS process. As described above, transimpedance amplifier 50 includes first stage 54, second stage 56 and feedback stage 58.

First stage 54 includes a high speed op-amp 60 which has two inputs and an output. One input of op-amp 60 is connected to a voltage reference, $V_{REF1}$. The other input is connected to a first node, NODE 1, connected to photodiode 52, as shown. Second stage 54 also includes a first N-channel transistor 62 and a second N-channel transistor 64 which have a ratio of 1 to N with respect to one another. In one embodiment of the present invention, N-channel transistor 64 is ratioed to be four times the size of N-channel transistor 62. N-channel transistor 62 has a drain connected to a power supply, a source connected to NODE 1 and a gate connected to the output of op-amp 60. N-channel transistor 64 has a drain connected to a second node, NODE 2, a source connected to NODE 1 and a gate connected to the output of op-amp 60.

Second stage 56 includes a first resistor 66 connected to NODE 2, as shown. Second stage 56 also includes a high speed op-amp 68 which has two inputs and an output. One input of op-amp 68 is connected to resistor 66, and the other input is connected to a voltage reference, $V_{REF2}$. The output of op-amp 68 provides the output, $V_{OUT}$, for transimpedance amplifier 50. As shown, a second resistor 70 is connected between the first input and the output of op-amp 68. In one embodiment of the present invention, resistor 66 has a value of 25K ohms, and resistor 70 has a value of 50K ohms.

Feedback stage 58 includes a transconductance amplifier 72 which has two inputs and an output. One input of transconductance amplifier 72 is connected to the output, $V_{OUT}$, and the other input is connected to the reference voltage, $V_{REF2}$. A capacitor 74 is connected between the output of transconductance amplifier 72 and ground potential. Together, transconductance amplifier 72 and capacitor 74 form an integrator for providing feedback from the output, $V_{OUT}$. Ambient noise cancellation loop 58 also includes an N-channel transistor 76 which has a gate connected to the output of transconductance amplifier 72, a drain connected to NODE 1 and a source connected to ground potential. A current source 78 is connected between the power supply and NODE 2 and provides a constant noise cancellation current $I_{AMBIENT}$.

In operation, transimpedance amplifier 50 processes current signals produced by photodiode 52 to provide voltage output, $V_{OUT}$. In the implementation of FIG. 4, first stage 54 includes op-amp 60 which is a high speed op-amp that operates to regulate and provide a virtual ground. Op-amp 60 drives at its output two source followers formed by N-channel transistors 62 and 64. Because these are both N-channel devices, the source followers drive the input node, NODE 1, which is attached to photodiode diode 52. The difference in size between N-channel transistors 62 and 64 means that the ratio of the current going through N-channel transistors 62 and 64 is 1 to N. Essentially, the ratio can be established so that most of the current flows through N-channel transistor 64. However, when the received signal is very large, N-channel transistor 62 operates to provide a source for supplying the large currents. N-channel transistor 62 needs to be large enough to supply the expected large currents, but needs to remain small enough so that N-channel transistor 64, which is N times the size of N-channel transistor 62, does not become too large. It should be understood that the operation of first stage 54 might be limited if the output impedance of N-channel transistor 64 is not large enough. If not, as is possible in a CMOS process, the embodiment of FIG. 1 is a better choice for implementation in the CMOS process.

Second stage 56 operates in two regions depending upon the size of the current signal. Second stage 56 acts as a transimpedance amplifier in the small signal case and as a voltage amplifier in the large signal case. For the small signal case, most of the current flows through N-channel transistor 64 and through NODE 2. This current is fed through second stage 56 where the transimpedance gain is set by resistor 70.

In the large signal case, photodiode 52 produces a large current signal which gets pulled through N-channel transistor 62. In this case, op-amp 60 regulates NODE 1 to the virtual ground. Essentially, for large signals, the current that gets supplied for photodiode diode 52 will be supplied directly from the supply through N-channel transistor 62. At the point where current source 78 has been depleted, the remaining current has to be supplied through N-channel transistor 62 to prevent the voltage level at NODE 1 from dropping. This functionality can be implemented as long as op-amp 60 can operate at high speed and N-channel transistor 62 has sufficient drive to supply the current.

After N-channel transistor 64 saturates, NODE 2 will drop down to the virtual ground which is regulated at $V_{REF1}$. So, for the large signal case, the output, $V_{OUT}$, becomes a voltage gain because there is no longer a high impedance feeding current. Instead, there is a low impedance because NODE 2 is pulled down to the virtual ground. In this case, the output, $V_{OUT}$, is based upon a standard gain chase established by resistor 66 and resistor 70. For example, where the values of resistors 66 and 70 are 25K ohms and 50K ohms, the gain is 2.5. For a 2.7 volt supply, this structure can provide a good range for the output in the large signal case. The voltage references $V_{REF1}$ and $V_{REF2}$ are set according to the supply voltage. In one embodiment having a 2.7 volt supply, $V_{REF1}$ is equal to 0.7 volts, which reverse biases photodiode 52, and $V_{REF2}$ is equal to 1.1 volts. The output, $V_{OUT}$, relative to the $V_{REF2}$, would then be equal to 2.5 times the difference between $V_{REF2}$ and $V_{REF1}$, or: 2.5 times 0.4 which is one volt. This means that the maximum value for $V_{OUT}$ would be about to 2.1 volts.

The large signal operation of transimpedance amplifier 50 handles the large currents without forcing large currents through the output. Even in the large current case, only the current needed, for example, to produce one volt across resistor 70 is supplied to the output node. Where resistor 70 is a 50K ohm resistor, that current is only twenty microamps. The current signal produced in the large signal case is not forced through the output node due to the operation of the source followers formed by N-channel transistors 62 and 64.

The noise cancellation performed by feedback stage 58 is beneficial to the function of an infrared receiver circuit. As discussed above, typical sources of ambient noise can produce currents that are several orders of magnitude larger than the transmitted signal. Thus, it is important to cancel the ambient noise so that the transmitted signal can be recovered. Essentially, feedback stage 58 operates as a high pass filter to remove the low frequency and DC components of the current signal produced by photodiode 52.

In the embodiment of FIG. 4, feedback stage 58 comprises transconductance amplifier 72 and a capacitor 74 which create an integrator that acts like a low pass filter. Transconductance amplifier 72 looks at the output, $V_{OUT}$, and compares the output with the same reference, $V_{REF2}$, used by second stage 56. Transconductance amplifier 72 then operates to force the difference to zero to provide negative feedback. Current source 78 operates to provide the steady state current $I_{DC}$ to bias the source-follower and to set-up a maximum level for ambient noise that can be canceled. This current supplied by current cource 78 allows the source follower to be operated at lower levels which provides noise advantages.

Long term, a current signal that is lower frequency than the cut-off frequency of feedback stage 58 will be substantially canceled. Higher frequency signals will pass through because feedback stage 58 will not react quickly enough to cancel the signal. Feedback stage 58 only reacts as fast as transconductance amplifier 72 and is designed to provide feedback to cancel low frequency and DC components.

Although the present invention has been described in detail, it should be understood that various changes, substitutions, and alterations can be made thereto without departing from the spirit and scope of the invention as defined by the appended claims.

What is claimed is:

1. A transimpedance amplifier for processing a current signal received from a circuit device, comprising:
    a first stage coupled to an input node for receiving a current signal from a circuit device, the first stage including a first amplifier operable to drive the input node, and the first stage operable to provide a current signal to a second node in response to the current signal at the input node;
    a second stage connected to the second node, the second stage including a second amplifier, and the second stage operable to convert the current signal at the second node into an output voltage signal at an output node; and
    a feedback stage connected to the first stage and the second stage, the feedback stage operable to receive the output voltage, and the feedback stage further operable to provide a feedback current signal to cancel ambient noise in the current signal at the input node.

2. The transimpedance amplifier of claim 1, wherein the first stage is further operable to limit the current signal received from the circuit device.

3. The transimpedance amplifier of claim 1, wherein the first stage further includes a current mirror circuit that is operable to provide the current signal to the second node in response to the current signal at the input node.

4. The transimpedance amplifier of claim 1, wherein the first stage further includes a pair of scaled source followers, the larger source follower operable to provide the current signal to the second node in response to the current signal at the input node.

5. The transimpedance amplifier of claim 4, wherein the pair of scaled source followers comprise:
    a first source follower operable to provide current to the input node responsive to the current signal, the first source follower further operable to provide a magnitude of current sufficient to supply a current signal in an upper dynamic range; and
    a second source follower operable to provide current to the circuit device responsive to the current signal, the second source follower scaled to be larger than the first source follower.

6. The transimpedance amplifier of claim 1, wherein the second stage has a small signal region of operation and a large signal region of operation, the second stage operating as a transimpedance amplifier in the small signal region and as a voltage amplifier in the large signal region.

7. The transimpedance amplifier of claim 1, wherein the input node is for receiving a current signal from a photodiode.

8. The transimpedance amplifier of claim 7, wherein the input node is for receiving a current signal from a photodiode used for receiving infrared transmissions.

9. The transimpedance amplifier of claim 1, wherein the transimpedance amplifier is implemented as an integrated circuit on a semiconductor chip using a CMOS process.

10. A method for constructing a transimpedance amplifier for processing a current signal received from a circuit device, comprising;
    forming an input node for receiving a current signal from a circuit device;
    forming a first stage connected to the input node for receiving a current signal from a circuit device such that the first stage includes a first amplifier operable to drive the input node, and such that the first stage is operable to provide a current signal to a second node in response to the current signal at the input node;
    forming a second stage connected to the second node such that the second stage includes a second amplifier, and such that the second stage is operable to convert the current signal at the second node into an output voltage signal at an output node; and
    forming a feedback stage connected to the first stage and the second stage such that the feedback stage is operable to receive the output voltage, and such that the feedback stage is further operable to provide a feedback current signal to cancel ambient noise in the current signal at the input node.

11. The method of claim 10, wherein forming the first stage comprises forming the first stage such that the first stage is further operable to limit the current signal received from the circuit device.

12. The transimpedance amplifier of claim 10, wherein forming the first stage comprises forming the first stage such that the first stage further includes a current mirror circuit that is operable to provide the current signal to the second node in response to the current signal at the input node.

13. The method of claim 10, wherein forming the first stage comprises forming the first stage such that the first stage further includes a pair of scaled source followers, the larger source follower operable to provide the current signal to the second node in response to the current signal at the input node.

14. The method of claim 13, wherein forming the pair of scaled source followers comprises:
    forming a first source follower operable to provide current to the input node responsive to the current signal, and further operable to provide a magnitude of current sufficient to supply a current signal in an upper dynamic range; and
    forming a second source follower operable to provide current to the circuit device responsive to the current signal, and the second source follower scaled to be larger than the first source follower.

15. The method of claim 10, wherein forming the second stage comprises forming the second stage such that the second stage has a small signal region of operation and a large signal region of operation, and the second stage operates as a transimpedance amplifier in the small signal region and as a voltage amplifier in the large signal region.

16. The method of claim 10, wherein forming the input node comprises forming an input node for receiving a current signal from a photodiode.

17. The transimpedance amplifier of claim 16, wherein forming the input node comprises forming the input node for receiving a current signal from a photodiode used for receiving infrared transmissions.

18. The method of claim 10, wherein the method is accomplished by forming an integrated circuit on a semiconductor chip using a CMOS process.

* * * * *